United States Patent [19]
Stewart et al.

[11] Patent Number: 5,521,938
[45] Date of Patent: May 28, 1996

[54] APPARATUS FOR PERFORMING FREQUENCY CONVERSION IN A COMMUNICATION SYSTEM

[75] Inventors: Kenneth A. Stewart, Palatine; Robert T. Love, Barrington, both of Ill.

[73] Assignee: Motorola, Inc., Schaumburg, Ill.

[21] Appl. No.: 276,073

[22] Filed: Jul. 1, 1994

[51] Int. Cl.$^6$ .............................. H04B 1/707; H04B 1/69
[52] U.S. Cl. ............................. 375/206; 375/200; 380/34; 329/305; 329/310
[58] Field of Search ............................. 328/15, 156, 158, 328/159, 165, 166; 329/301, 303, 305, 310; 307/424, 529, 260, 261, 269, 271, 272.1; 375/200–210, 1; 380/34

[56] References Cited

U.S. PATENT DOCUMENTS

| | | | |
|---|---|---|---|
| 3,656,064 | 4/1972 | Giles et al. | 329/303 |
| 3,674,935 | 7/1972 | Lawrence | 329/303 X |
| 3,982,195 | 9/1976 | Turner | 329/310 |
| 4,785,463 | 11/1988 | Janc et al. | 375/1 |
| 4,968,981 | 11/1990 | Sekine et al. | 375/1 X |
| 4,972,430 | 11/1990 | Cantwell | 375/1 |
| 5,120,997 | 6/1992 | Cantwell | 375/1 X |
| 5,341,396 | 8/1994 | Higgins et al. | 375/1 |

*Primary Examiner*—Bernarr E. Gregory
*Attorney, Agent, or Firm*—Richard A. Sonnentag

[57] ABSTRACT

An efficient apparatus for performing frequency conversion from a final IF frequency to a baseband frequency is described. A counter (401) generates two logical signals G1 (402) and G2 (403) which are passed to an exclusive-OR gate (404) and a multiplexer (406). When a control signal (411) is deasserted, multiplexer (406) passes signal G1 to I1 and signal G2 to I2; when control signal (411) is asserted, multiplexer (406) passes binary signal G1 to I2 (410) and signal G2 to I1 (407). Similarly, multiplexer (405) swaps its input real and imaginary samples when the output of exclusive-OR gate (404) is asserted; otherwise, it performs no operation on its input samples. Signals I1 (407) and I2 (410) are used to control arithmetic inverters (408) and (409) respectively. When the controlling signal for either inverter is asserted, the inverter performs arithmetic inversion, otherwise it performs no operation.

12 Claims, 4 Drawing Sheets

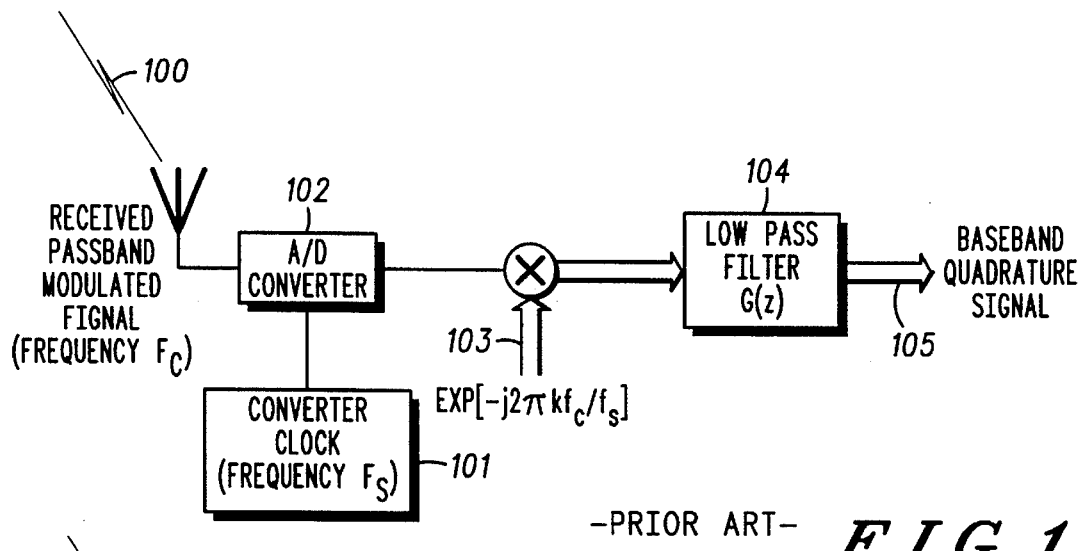
-PRIOR ART-
*FIG. 1*
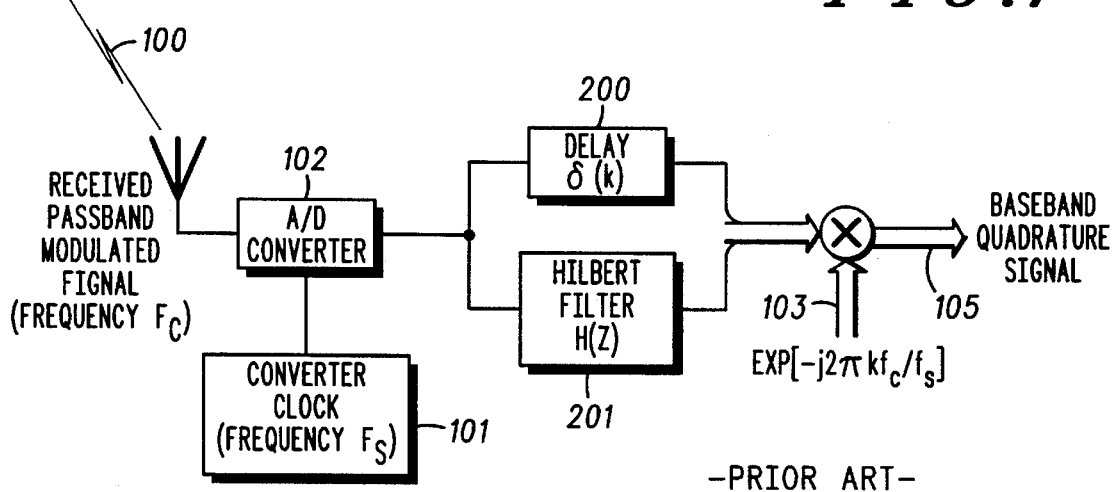
-PRIOR ART-
*FIG. 2*
*FIG. 6*
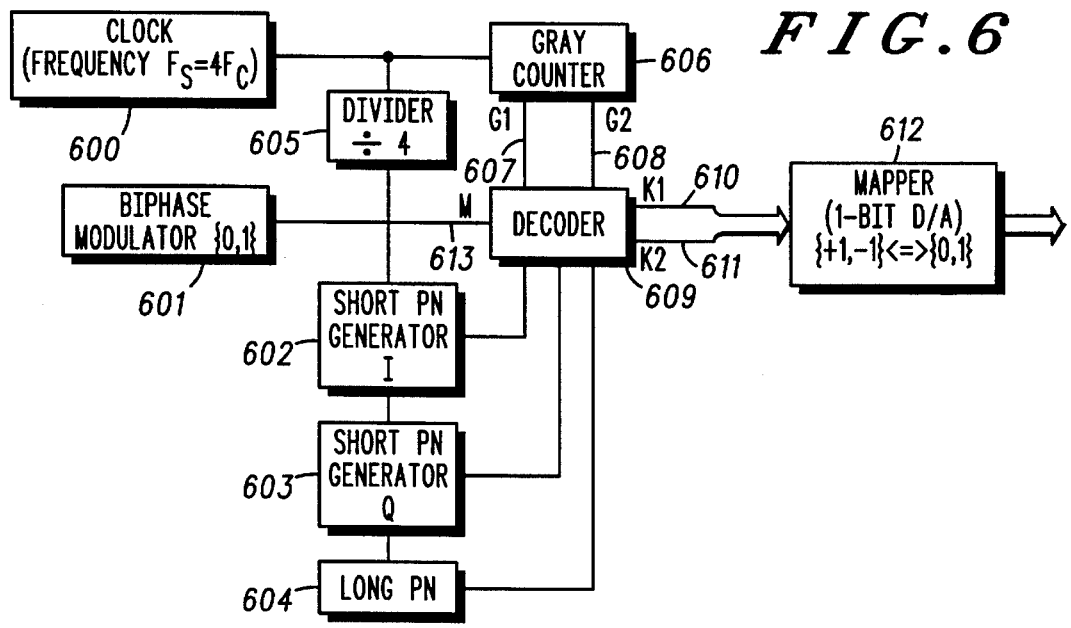

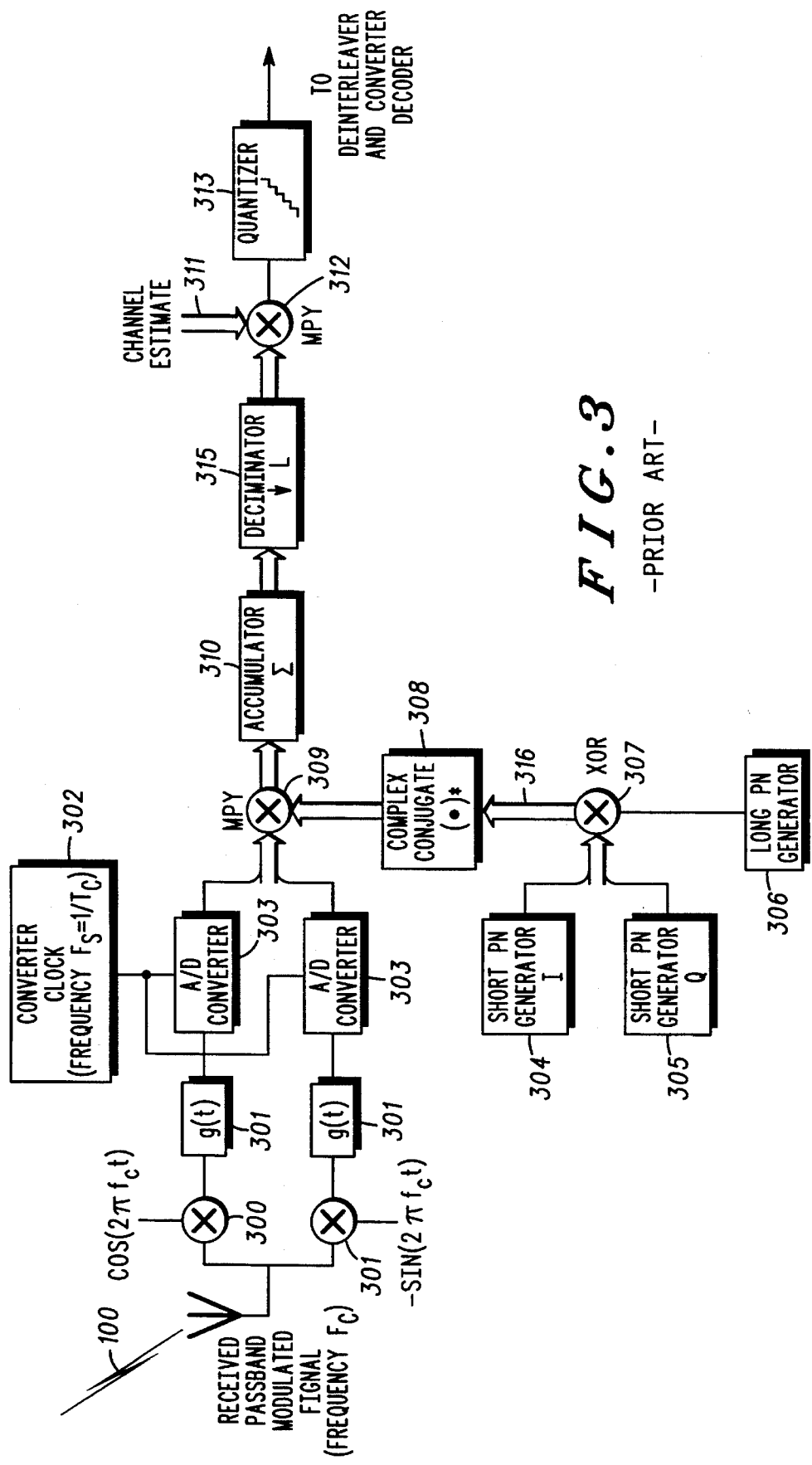

5,521,938

APPARATUS FOR PERFORMING FREQUENCY CONVERSION IN A COMMUNICATION SYSTEM

FIELD OF THE INVENTION

The present invention relates to communication systems and more particularly to frequency conversion in such communication systems.

BACKGROUND OF THE INVENTION

Frequency conversion, or modulation, of a signal from one carrier frequency to another (where the bandwidth of the signal is much less than the carrier frequency), is an obvious and central part of any radio receiver or transmitter. In the classic linear super heterodyne receiver design, a modulated radio frequency (RF) carrier wave is frequency converted through a descending sequence of intermediate frequencies (or IF's) until the underlying modulation (sometimes referred to as the 'envelope' or 'baseband signal') is centered at zero-frequency and the embedded information (whether an analog signal or modulated digital data) may be extracted. Similarly, efficient transmission and spectrum sharing requires frequency conversion of the baseband signal to an appropriate carrier frequency, although in order to simplify the following discussion the focus will be on frequency demodulation or downconversion.

Most contemporary frequency converters (or 'mixer') circuits are based on the doubly balanced mixer (DBM) or 'diode-ring' design. It is well known that because of tolerances in the component diode characteristics, and stray capacitances and inductances in the component transformers, DBM's can suffer from carrier feed through (that is, local oscillator port to RF output port coupling) as well as nonlinear signal distortion in the IF to RF signal path. These problems are further complicated in the case of digital communications systems employing modulation schemes such as BPSK, QPSK, OQPSK, π/4-QPSK, M-ary PSK etc. In these instances, quadrature demodulation of the passband signal is generally required to recover the complex baseband signal used in transmission. In a quadrature mixer, the basic problems of the analog DBM persist, but since two local oscillator reference frequencies of equal amplitude and with a 90° phase difference are now required, there is the additional problem of local oscillator amplitude and phase balancing.

The problems inherent in DBM's can be avoided by the use of discrete-time digital signal processing (DSP) techniques, and this has led to the development of a general class of devices known as numerically controlled oscillators (NCO's). An NCO typically comprises a multibit phase accumulator, single-quadrant sine function lookup table, and a complex digital multiplier. When operating as a mixer, its function is to transform a passband signal y(k) through the discrete-time complex frequency shift operator $$y(k) = x(k)e^{-j2\pi k \frac{f_c}{f_s}}$$

to form the complex baseband signal x(k) where $f_c$ is the passband center frequency and $f_s$ is the sample rate. The NCO does this by accumulating a modulo-$2\pi$ phase $[k\Delta\theta]_{2\pi}$ which is used to address the sine lookup table. The resulting complex exponential term is multiplied with the passband signal sample y(k) to generate x(k). $\Delta\theta$ is the phase step size which establishes the effective normalized conversion frequency $f_c/f_s$.

The use of this type of digital downconversion in digital communication receivers also allows the required number of A/D converters to be reduced from two (one for each of the in-phase and quadrature signal components that are generated by an analog quadrature mixer) to one as shown in FIG. 1. This is achieved by sampling, in an A/D converter (102), the received signal as a real-valued passband waveform (100). The digital sample stream is then converted into the quadrature components by use of an NCO (103), and low pass filtering (104). Note that the sample clock $f_s$ (101) of the A/D converter (102) is selected to satisfy the Nyquist condition that the sample rate be greater than twice the maximum frequency of the modulated carrier. An alternative and less common method which is shown in FIG. 2 is to use a Hilbert filter (201)—sometimes referred to as a "phase splitter"—before the NCO. The Hilbert filter (201) implements the digital equivalent of the continuous-time impulse response h(t)=1/πt which is the same as performing a Hilbert transform on the input signal to the filter. The net response of the delay (200) and the Hilbert filter (201) shown in FIG. 2 is to produce a frequency response which is zero in the negative half-plane of the frequency domain and unity in the positive half, with the result that the passband signal is reduced to a single-sided analytic signal before downconversion by the NCO (103) to baseband. Methods for the efficient design and implementation of digital Hilbert filters are well known in the literature; for example, see *Digital Communications*, E. A. Lee, D. G. Messerschmitt, Kluwer Academic, 1988, USA, pp. 240.

It is also well known that the structure of the NCO may be greatly simplified by choosing the final IF frequency and sample clock such that $f_s=4f_c$. This is equivalent to centering the passband carrier frequency at 0.25 Hz normalized to the A/D sample rate, which allows the sequence $$e^{-j2\pi k \frac{f_c}{f_s}}$$

to be reduced to the cyclic sequence {1+j0, 0−j1, −1+j0, 0+j1, 1+j0, 0−j1, ... }. This in turn means that the NCO can be reduced to a complex multiplier whose non-signal argument is simply the sequence {1+j0, 0−j1, −1+j0, 0+j1, 1+j0, ... }. Since the sign of both components of this multiplicand is either unity or zero, the complex multiplication used to perform downconversion is simplified. As shown in U.S. Pat. No. 4,785,463, "Digital Global Positioning System Receiver," efficient designs have been proposed for implementing this scheme in combination with the low pass filtering operation of FIG. 1. However, efficient implementations based on the Hilbert filter approach of FIG. 2 are not shown in the prior art. Thus, a need exists for such an implementation.

BRIEF DESCRIPTION OF THE DRAWINGS

FIG. 1 generally depicts, in block diagram form, a prior art implementation for converting a received passband signal to a sampled complex baseband equivalent signal, FIG. 2 generally depicts, in block diagram form, a prior art implementation for converting a received passband signal to a sampled complex baseband equivalent signal by use of a Hilbert transformer, FIG. 3 generally depicts, in block diagram form, a prior art implementation for performing frequency conversion and despreading for a coherent quadriphase spread signal such as that used on the forward link of the TIA/EIA IS95 standard cellular radio system, FIG. 4 generally depicts, in block diagram form, an implementation for performing frequency downconversion or upconversion in accordance with the invention.

FIG. 6 generally depicts, in block diagram form, an implementation for simultaneously performing frequency upconversion and DS-SS spreading in accordance with the invention.

DETAILED DESCRIPTION OF A PREFERRED EMBODIMENT

Figure 4:
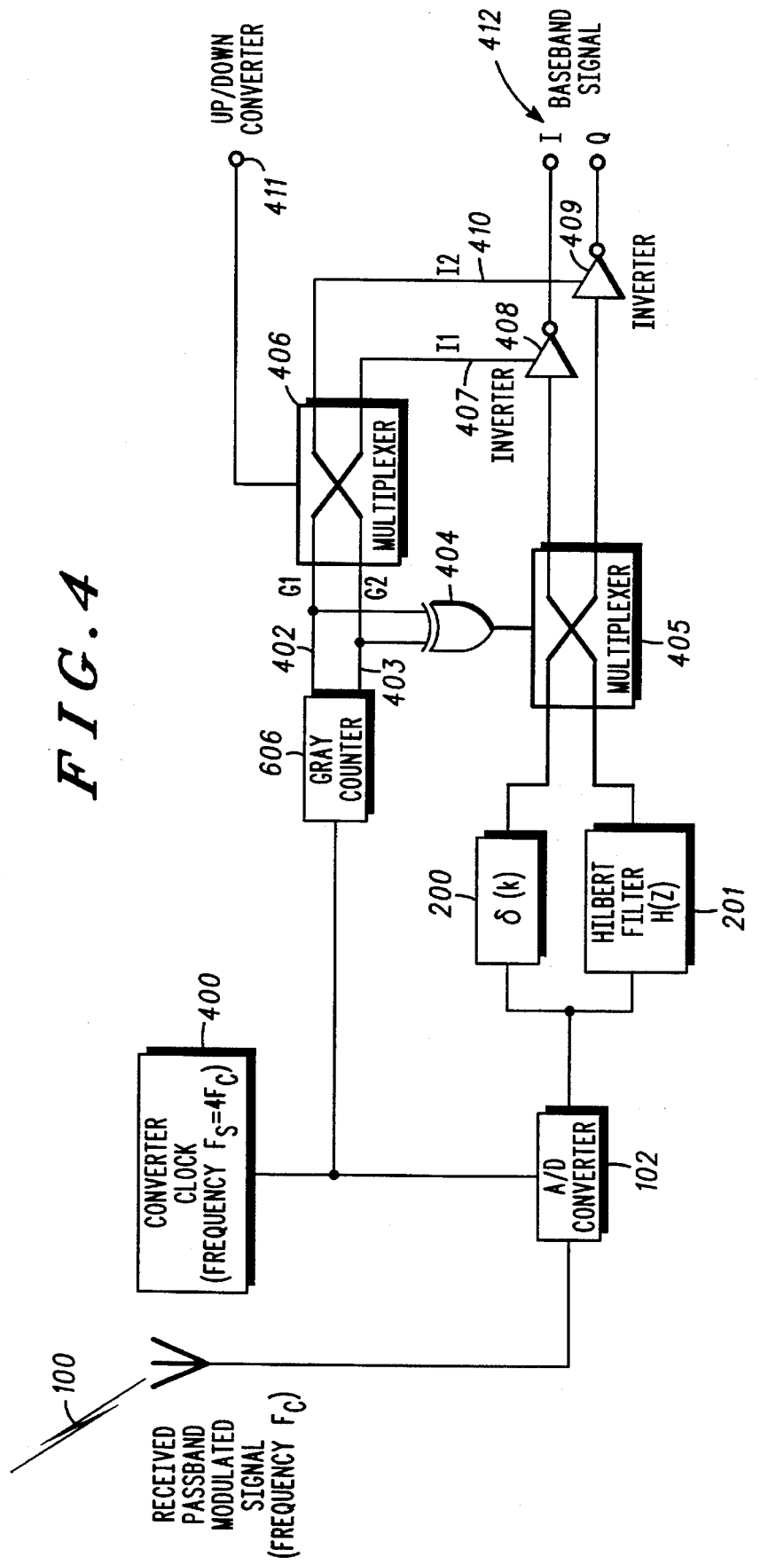

An efficient apparatus for performing frequency conversion from a final IF frequency to a baseband frequency is described in accordance with the invention. A counter generates two logical signals G1 and G2 which are passed to an exclusive-OR gate and a multiplexer. When a control signal is deasserted, multiplexer passes signal G1 to I1 and signal G2 to I2; when control signal is asserted, multiplexer passes binary signal G1 to I2 and signal G2 to I1. Similarly, multiplexer swaps its input real and imaginary samples when the output of exclusive-OR gate is asserted; otherwise, it performs no operation on its input samples. Signals I1 and I2 are used to control arithmetic inverters and respectively. When the controlling signal for either inverter is asserted, the inverter performs arithmetic inversion, otherwise it performs no operation.

The digital approach to final frequency conversion is particularly suited to receivers which already have high speed digital signal processing capability located near to the A/D converters. An important class of such receivers are those using direct-sequence spread spectrum (DS-SS) methods. Although traditionally used for military applications where the low probability of interception and robustness to jamming offered by DS-SS made the method attractive, DS-SS has recently been proposed for a number of public land-mobile communications systems where multiple access is achieved by spreading code division. A good example is the code division multiple access (CDMA) air interface for cellular radio communications specified by Telecommunications Industry Association standard TIA/EIA IS-95. See TIA/EIA Interim Standard, *Mobile Station-Base Station Compatibility Standard for Dual-Mode Wideband Spread Spectrum Cellular System,* Telecommunications Industry Association, July 1993.

A number of different spreading sequences are available to form DS-SS transmissions—those most commonly used include maximal-length pseudo-random (PN) binary sequences or Gold codes, either of which may be used individually to achieve biphase spreading or in pairs to perform quadriphase spreading. In the latter technique, the underlying modulation (which may be real or complex valued) is spread by a complex sequence whose real and imaginary components are formed by a different binary sequence. This is the approach used in the TIA/EIA IS-95 standard. In that standard, the forward link (base station to mobile station) uses direct quadriphase or QPSK spreading where the spreading sequence is derived by exclusive-ORing each of two 'short' PN sequences (of length $2^{15}$) with a user-specific 'long' PN sequence (of length $2^{42}-1$) to form the complex spreading waveform. The reverse link (mobile station to base station) uses an almost identical spreading mechanism except that the imaginary component of the spread waveform is delayed by one half chip to form an offset quadriphase or OQPSK transmission. (This modification is mainly intended to alleviate the effect of nonlinearities in the mobile station transmitter).

FIG. 3 shows the conventional approach to downconverting and despreading the IS-95 forward link transmission. In FIG. 3, the received passband signal (100) is quadrature downconverted from the final IF frequency to baseband by an analog quadrature demodulator (300). The resulting signal is then low pass filtered by an analog filter (301) matched to the pulse shape of the transmitted chips, and then sampled by A/D converter (303) at the chip rate $T_c$, where the timing (302) of the sampling process is controlled by a device such as a delay lock loop or tau-dither loop (not shown). Following sampling, the in-phase (I) and quadrature (Q) components of the complex sampled data are multiplied (309) by the complex conjugate (314) of the composite spreading sequence (316) used to generate the original spread waveform. As can be seen in the figure, this despreading signal is formed from the exclusive-OR (307) of the short (304, 305) and long PN (306) sequences followed by inversion of the imaginary part of the resulting spreading sequence (308). The resulting signal is then integrated-and-dumped over a period equal to the number of chips comprising each BPSK symbol of the underlying IS-95 forward link waveform (310). Following decimation (315) to a sample rate equal to the modulated symbol rate, the resulting sample stream is then phase-rotated and scaled (312) by a channel estimate (311) formed by observing the pilot signal transmitted by an IS-95 base station. The resulting coherent decision statistic is then presented to the soft decision quantizer (313) and ultimately to the deinterleaver and convolutional decoder (not shown).

FIG. 4 depicts a block diagram of an apparatus for efficient frequency conversion in accordance with the invention. In the FIG. 4, a Gray counter (401), clocked (400) at the signal sample rate $f_s=4f_c$, generates two logical signals G1 (402) and G2 (403) which are passed to an exclusive-OR gate (404) and a multiplexer (406). Multiplexer (406) is controlled by an upconvert/downconvert binary signal (411). When signal (411) is deasserted (i.e. the circuit is set to 'downconvert' mode) multiplexer (406) passes signal G1 to I1 and signal G2 to I2; when signal (411) is asserted (i.e. set to 'upconvert' mode) multiplexer (406) passes binary signal G1 to I2 (410) and signal G2 to I1 (407). Similarly, multiplexer (405) swaps its input real and imaginary samples when the output of exclusive-OR gate (404) is asserted; otherwise, it performs no operation on its input samples. Signals I1 (407) and I2 (410) are used to control arithmetic inverters (408) and (409) respectively. When the controlling signal for either inverter is asserted, the inverter performs arithmetic inversion, otherwise it performs no operation.

The operation of the block diagram of FIG. 4 may be better understood with reference to TABLE 1 and TABLE 2 below.

TABLE 1

| G1 | G2 | Multiplexer (405) | I1 | I2 |
|---|---|---|---|---|
| 0 | 0 | 0 | 1 | 1 |
| 0 | 1 | X | 1 | −1 |
| 1 | 1 | 0 | −1 | −1 |

TABLE 1-continued

| G1 | G2 | Multiplexer (405) | I1 | I2 |
|---|---|---|---|---|
| 1 | 0 | X | −1 | 1 |

TABLE 1 describes the truth table for operation of the frequency converter of FIG. 4 in the downconvert mode of operation.

TABLE 2

| G1 | G2 | Multiplexer (405) | I1 | I2 |
|---|---|---|---|---|
| 0 | 0 | 0 | 1 | 1 |
| 0 | 1 | X | −1 | 1 |
| 1 | 1 | 0 | −1 | −1 |
| 1 | 0 | X | 1 | −1 |

TABLE 2 describes the truth table for operation of the frequency converter of FIG. 4 in the upconvert mode of operation. In TABLE 1 and TABLE 2, an 'X' indicates that multiplexer (405) swaps the real and imaginary components of the complex signal I+jQ formed at the output of the delay element (200) and Hilbert filter (201). Delay element (200) and Hilbert filter (201) in combination form a Hilbert filter configuration. The state of the inverters (408) and (409) is indicated by the sign of columns I1 and I2. In downconvert mode, it can be seen that the resulting baseband signal (412) follows the sequence {I+jQ, Q−jI, −I−jQ, −Q+jI, I+jQ, . . . }. It will be appreciated that, as discussed above, since the complex-equivalent frequency downconversion sequence generated by $e^{-jk\pi/2}$ is {1+j0, 0−j1, −1+j0, 0+j1, 1+j0, . . . }, and since multiplication of I+jQ by that sequence generates the sequence {I+jQ, Q−jI, −I−jQ, −Q+jI, I+jQ, . . . }, the output of the circuit of FIG. 4 performs frequency downconversion by a normalized frequency of 0.25 as required by the general method of FIG. 2 when $f_s=4f_c$. Likewise, in upconverter mode, as described by the truth table, TABLE 2, the output sequence generated by the circuit is {I+jQ, −Q+jI, −I−jQ, Q−jI, I+jQ, . . . }. Since this is equivalent to multiplication by the sequence $e^{+jk\pi/2}$, the circuit is performing frequency upconversion by a normalized frequency of 0.25. Clearly, elements (100, 102, 200, 201) would generally not precede the upconverter mode of operation since they are required solely for frequency downconversion. Rather, the complex signal entering the multiplexer (405) would be the output of a complex modulator or spreader and the output (412) would feed a filter and transmit amplifier. The remainder of the circuit is identical, however, so the upconverter form is not explicitly shown.

It will be appreciated that the switches and inverters shown in FIG. 4 may be implemented as either digital or analog discrete-time structures depending on whether a digital implementation is used, or a discrete-time analog implementation, such as a switch-capacitor design, is employed. In the digital case, the switches and inverters would be formed from digital multiplexers and two's-complement inverters; in the analog case, operational amplifier circuits would be used. Note also that the Gray counter could be replaced with a binary counter or any other 4-state sequential machine. Also, any desired oversampling rate for the complex baseband symbols in a digital communications receiver observable at (411) may be achieved by setting the final IF frequency $f_c$ to be equal to the desired oversampling rate. The relationship between $f_c$ and $f_s$ is as before.

Figure 5:
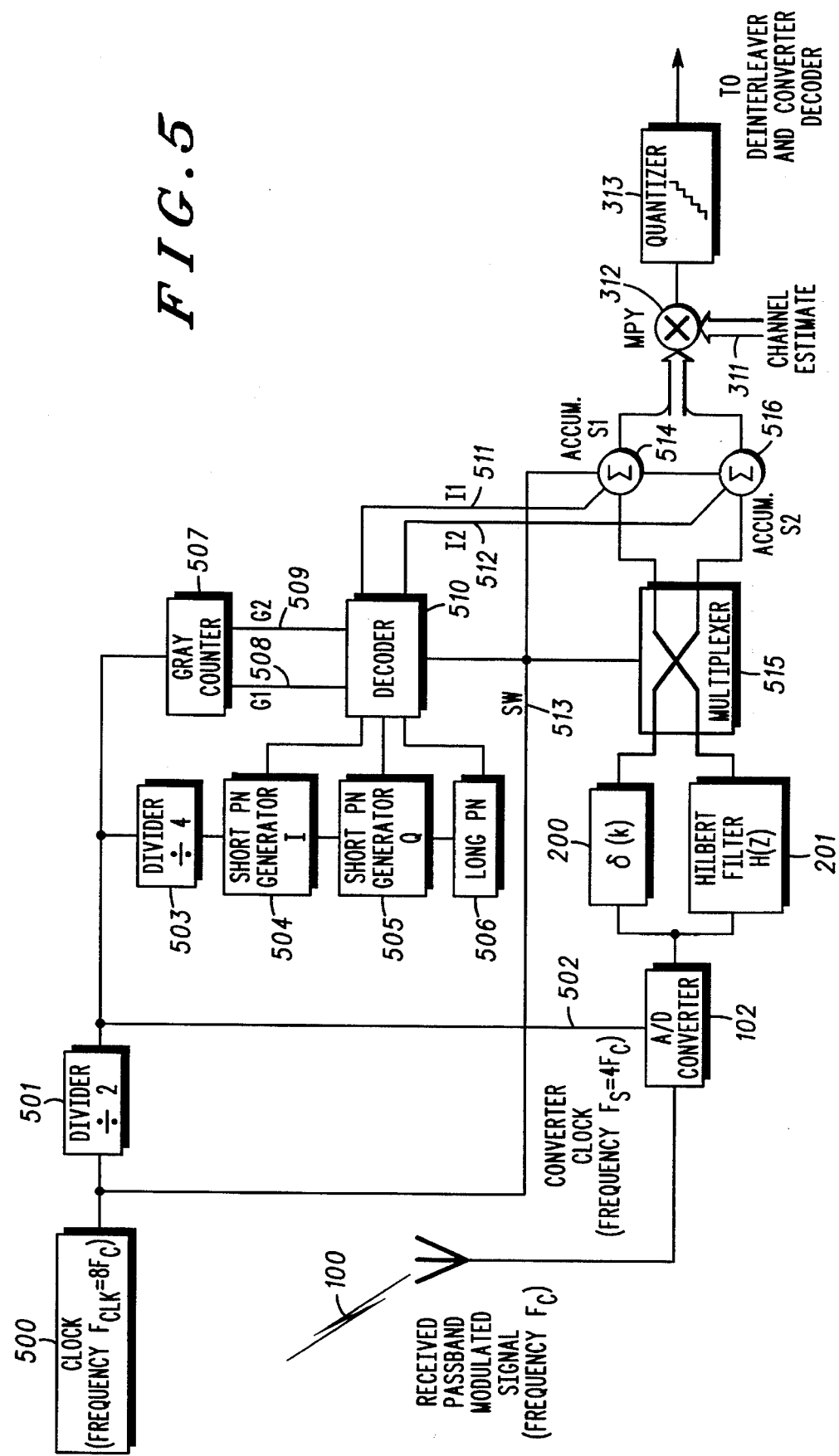
FIG. 5 generally depicts, in block diagram form, an implementation for simultaneously performing frequency downconversion and DS-SS despreading in accordance with the invention.

The frequency converter of FIG. 4 may be modified to also perform DS-SS despreading as shown in FIG. 5. In FIG. 5, A/D converter (102), delay (200), and Hilbert filter (201) follow the scheme outlined in FIG. 2, with the received passband signal now centered at $f_c=4/T_c$ where $T_c$ is the chip interval. Starting from a clock (500) operating at frequency $f_{clk}=8f_c$, two dividers (501, 503) generate a chip-rate clock signal suitable for clocking the short and long PN generators (504, 505, 506). The state variable outputs G1 and G2 (508, 509) of a 4-state Gray counter (507) clocked at frequency $4f_c$ are then passed along with the PN generator outputs (504, 505, 506) to a decoder (510) which controls the function of the accumulators S1 and S2 (514, 516) via signals I1 and I2 (511, 512). If I1 or I2 are not asserted, the corresponding accumulator S1 or S2 adds the signal sample argument provided by multiplexer (515) to its respective accumulated value, otherwise the argument is subtracted from the accumulated value. At the same time, clock signal (500) is divided by two and passed to A/D converter (102) as the conversion clock. Clock signal (500) is also fed directly to a multiplexer (515). When clock signal (500) (also labeled signal SW (513) in the figure) is asserted, multiplexer (515) swaps the in-phase and quadrature components of the complex signal arguments generated by the delay and Hilbert filter (200, 201), otherwise the complex signal sample passes directly into the accumulators S1 and S2 (514, 516). For each complex signal sample emerging from the delay and Hilbert filter (200, 201), therefore, two samples are either positively or negatively accumulated by accumulators S1 and S2 (514, 516) per change of state of the Gray counter (507). Equivalently, eight samples are accumulated per change of PN generator output. The contents of the accumulators are then corrected for channel phase rotation (311, 312) and quantized (313) as in FIG. 3.

The operation of the block diagram may be better understood by reference to TABLE 3, which also defines the logic required in the decoder (510).

TABLE 3

| LPN ⊕ SPN-I | LPN ⊕ SPN-Q | G1 | G2 | PN* Re{ } | PN* Im{ } | CVT Re{ } | CVT Im{ } | PN × CVT Re{ } | PN × CVT Im{ } | I1(0) | I1(1) | I2(0) | I2(1) |
|---|---|---|---|---|---|---|---|---|---|---|---|---|---|
| 0 | 0 | 0 | 0 | 1 | −1 | 1 | 0 | 1 | −1 | 1 | 1 | 1 | −1 |
| 0 | 1 | 0 | 0 | 1 | 1 | 1 | 0 | 1 | 1 | 1 | −1 | 1 | 1 |
| 1 | 0 | 0 | 0 | −1 | −1 | 1 | 0 | −1 | −1 | −1 | 1 | −1 | −1 |
| 1 | 1 | 0 | 0 | −1 | 1 | 1 | 0 | −1 | 1 | −1 | −1 | −1 | 1 |
| 0 | 0 | 0 | 1 | 1 | −1 | 0 | −1 | −1 | −1 | −1 | 1 | −1 | −1 |
| 0 | 1 | 0 | 1 | 1 | 1 | 0 | −1 | 1 | −1 | 1 | 1 | 1 | −1 |
| 1 | 0 | 0 | 1 | −1 | −1 | 0 | −1 | −1 | 1 | −1 | −1 | −1 | 1 |
| 1 | 1 | 0 | 1 | −1 | 1 | 0 | −1 | 1 | 1 | 1 | −1 | 1 | 1 |
| 0 | 0 | 1 | 1 | 1 | −1 | −1 | 0 | −1 | 1 | −1 | −1 | −1 | 1 |

TABLE 3-continued

| LPN ⊕ SPN-I | LPN ⊕ SPN-Q | G1 | G2 | PN* Re{ } | PN* Im{ } | CVT Re{ } | CVT Im{ } | PN × CVT Re{ } | PN × CVT Im{ } | I1(0) | I1(1) | I2(0) | I2(1) |
|---|---|---|---|---|---|---|---|---|---|---|---|---|---|
| 0 | 1 | 1 | 1 | 1 | 1 | -1 | 0 | -1 | -1 | -1 | 1 | -1 | -1 |
| 1 | 0 | 1 | 1 | -1 | -1 | -1 | 0 | 1 | 1 | 1 | -1 | 1 | 1 |
| 1 | 1 | 1 | 1 | -1 | 1 | -1 | 0 | 1 | -1 | 1 | 1 | 1 | -1 |
| 0 | 0 | 1 | 0 | 1 | -1 | 0 | 1 | 1 | 1 | 1 | -1 | 1 | 1 |
| 0 | 1 | 1 | 0 | 1 | 1 | 0 | 1 | -1 | 1 | -1 | -1 | -1 | 1 |
| 1 | 0 | 1 | 0 | -1 | -1 | 0 | 1 | 1 | -1 | 1 | 1 | 1 | -1 |
| 1 | 1 | 1 | 0 | -1 | 1 | 0 | 1 | -1 | -1 | -1 | 1 | -1 | -1 |

The first two columns of the table show the possible states of the exclusive-OR'ed short and long PN sequences, while the columns titled "G1" and "G2" indicate the Gray counter (507) output states (508, 509). The next column—marked "PN*"—shows the real and imaginary parts of the complex conjugate of the original quadriphase spreading signal, while the column entitled "CVT" indicates the complex multiplier required to implement the simplified frequency conversion scheme described in FIG. 4 and which is controlled by the Gray counter output. Column "PN*xCVT" indicates the resulting complex arithmetic product of columns "PN*" and "CVT". This column provides the required values of signals I1 and I2 (511, 512) during consecutive period of the clock signal SW (513). In TABLE 3, the value of I1 during the first clock period is indicated as "I1(0)" while that for the second period is indicated as "I1(1)". Signal I2 is similarly treated. Also, I1 and I2 are listed in terms of the arithmetic function implemented by the accumulator under their respective control, although they are of course logical signals derivable from TABLE 3 through the mapping {0,1}<->{1,-1}. As an example, consider the configuration of PN sequences and Gray counter states G1 and G2 indicated by the first row of TABLE 3. Under this configuration of PN generator and Gray counter states, accumulator S1 first adds to its internal accumulated value the real component of the sample at the delay/Hilbert filter output (200, 201) during the first period of clock signal SW (513), and then adds the imaginary component of the delay/Hilbert filter during the second period of SW. At the same time, accumulator S2 first adds the imaginary part of the signal sample at the delay/Hilbert filter output, then subtracts the real part, during the following period of SW.

Clearly, the block diagram of FIG. 5 substantially simplifies that of FIG. 3 by eliminating frequency converter (300), one of the A/D converters (301), and much of the complex conjugator (308) complex multiplier (309), and accumulator (310). It will be readily appreciated by one skilled in the art that the block diagram of FIG. 5 can be easily modified for biphase spreading by simply removing one of the short PN generators (504) or (505) as an input to the decoder, and slightly modifying TABLE 3.

FIG. 6 shows an efficient implementation for a combined frequency upconverter and quadriphase spreader to be used on the transmit side of a DS-SS radio where the underlying modulation consists of antipodal samples (such as those generated by BPSK at the symbol rate and M-ary orthogonal signalling at the orthogonal symbol chip rate). In FIG. 6, a clock (600) running at frequency $f_s=4f_c$ feeds directly to a Gray counter (606) and, via a divide by four operation, to the quadriphase spreading sequence generators (602, 603, 604). The biphase modulated data sample M (613), the Gray counter state (represented by state variables G1 (607) and G2 (608)), and the spreading sequences are then passed to a decoder (609) which generates two signals K1 (610) and K2 (611) which represent the quadriphase spread transmit signal. These are then converted to passband frequency after conversion by a 1-bit D/A converter (612).

The operation of the block diagram and the logical function implemented by the decoder block (609) may be more easily understood with reference to the truth table in TABLE 4.

TABLE 4

| LPN ⊕ SPN-I | LPN ⊕ SPN-Q | G1 | G2 | PN Re{ } | PN Im{ } | CVT Re{ } | CVT Im{ } | PN × CVT Re{ } | PN × CVT Im{ } | Logical PN × CVT Re{ } | Logical PN × CVT Im{ } |
|---|---|---|---|---|---|---|---|---|---|---|---|
| 0 | 0 | 0 | 0 | 1 | 1 | 1 | 0 | 1 | 1 | 0 | 0 |
| 0 | 1 | 0 | 0 | 1 | -1 | 1 | 0 | 1 | -1 | 0 | 1 |
| 1 | 0 | 0 | 0 | -1 | 1 | 1 | 0 | -1 | 1 | 1 | 0 |
| 1 | 1 | 0 | 0 | -1 | -1 | 1 | 0 | -1 | -1 | 1 | 1 |
| 0 | 0 | 0 | 1 | 1 | 1 | 0 | 1 | -1 | 1 | 1 | 0 |
| 0 | 1 | 0 | 1 | 1 | -1 | 0 | 1 | 1 | 1 | 0 | 0 |
| 1 | 0 | 0 | 1 | -1 | 1 | 0 | 1 | -1 | -1 | 1 | 1 |
| 1 | 1 | 0 | 1 | -1 | -1 | 0 | 1 | 1 | -1 | 0 | 1 |
| 0 | 0 | 1 | 1 | 1 | 1 | -1 | 0 | -1 | -1 | 1 | 1 |
| 0 | 1 | 1 | 1 | 1 | -1 | -1 | 0 | -1 | 1 | 1 | 0 |
| 1 | 0 | 1 | 1 | -1 | 1 | -1 | 0 | 1 | -1 | 0 | 1 |
| 1 | 1 | 1 | 1 | -1 | -1 | -1 | 0 | 1 | 1 | 0 | 0 |
| 0 | 0 | 1 | 0 | 1 | 1 | 0 | -1 | 1 | -1 | 0 | 1 |
| 0 | 1 | 1 | 0 | 1 | -1 | 0 | -1 | -1 | -1 | 1 | 1 |
| 1 | 0 | 1 | 0 | -1 | 1 | 0 | -1 | 1 | 1 | 0 | 0 |
| 1 | 1 | 1 | 0 | -1 | -1 | 0 | -1 | -1 | 1 | 1 | 0 |

The first two columns represent the exclusive-OR of the long PN sequence with each short PN sequence, while the columns labeled "G1" and "G2" show the states (607, 608) of the Gray counter (606). The column titled "PN" shows the real and imaginary arithmetic signals corresponding to the first two columns, while column "CVT" shows the complex frequency upconversion sequence derived from the Gray counter state. Column "PNxCVT" lists the result of multiplying the complex PN spreading sequnce with the upconversion sequence, with column "Logical PNxCVT" showing the logical equivalent under the mapping $\{0,1\} \leftrightarrow \{1,-1\}$. Signals K1 (610) and K2 (611) are finally generated by exclusive-ORing the real and imaginary parts respectively of column "Logical PNxCVT" with the modulator signal M (614). The decoder block (609) therefore implements the logical functions required to exclusive-OR the long PN and short PN sequences, generate the "Logical PNxCVT" signals from the resulting composite PN sequence and Gray counter states G1 and G2 (607, 608). One skilled in the art will appreciate that these logical functions may be reduced to a minimal logical form by use of simple techniques such as Karnaugh mapping. It will also be appreciated that the invention may be extended to include the case of biphase spreading by eliminating one of the PN generators.

While the invention has been particularly shown and described with reference to a particular embodiment, it will be understood by those skilled in the art that various changes in form and details may be made therein without departing from the spirit and scope of the invention.

What we claim is:

1. An apparatus for performing frequency conversion in a communication system, the apparatus comprising:

a counter having a clock signal as input and a plurality of signals as output;

a switch having as input and output in-phase and quadrature components of a signal at a first frequency and having as input a control signal for interchanging as output the in-phase and quadrature components of the signal at the first frequency;

at least one inverter, having as input the in-phase and quadrature components of the signal output of the switch and one of the plurality of signals output from the counter and having as output the in-phase and quadrature components of the signal at a second frequency; and a logic gate, having as input the plurality of signals output from the counter and as output the control signal based on a combination of the plurality of signals output from the counter.

2. The apparatus of claim 1 wherein the first frequency or second frequency is either a baseband frequency or a passband frequency.

3. The apparatus of claim 1 wherein the counter further comprises a Gray counter.

4. The apparatus of claim 1 wherein the logic gate further comprises an exclusive-OR (XOR) logic gate.

5. The apparatus of claim 1 wherein the apparatus is implemented in either a direct sequence spread spectrum (DS-SS) transmitter or receiver implementing a Hilbert filter configuration.

6. The apparatus of claim 1 wherein the output of the inverter further comprises the in-phase and quadrature components of the signal at a second frequency being output from a plurality of inverters.

7. An apparatus for despreading a spread spectrum signal, the apparatus comprising:

signal receiving means, for receiving the spread spectrum signal;

a digitizer coupled to the signal receiving means;

a Hilbert filter configuration, coupled to the digitizer;

a counter having a clock signal as input and a plurality of signals as output;

plurality of pseudo-random noise generators;

a decoder coupled to the pseudorandom noise generators and outputting control information;

a multiplexer having input from the Hilbert filter configuration and outputting a signal sample arguments; and first and second accumulators, having as input the signal sample arguments, for accumulating the signal sample arguments based on the control information.

8. The apparatus of claim 7 wherein the first and second accumulators accumulate by either adding or subtracting the signal sample arguments from an accumulated value.

9. The apparatus of claim 7 wherein the apparatus is implemented in a direct sequence spread spectrum (DS-SS) receiver.

10. An apparatus for spreading a signal to generate a spread spectrum signal, the apparatus comprising:

a counter having a clock signal as input and a plurality of signals as output;

a plurality of pseudo-random sequence generators;

a decoder for generating multi-phase spread transmit signals based on input from the plurality of pseudorandom sequences generators and a combination of the plurality of signals from the counter; and a converter for converting the generated multi-phase spread transmit signals into a form for transmission.

11. The apparatus of claim 10 wherein the multi-phase spread transmit signals further comprises either biphase spread transmit signals or quadriphase spread transmit signals.

12. The apparatus of claim 10 wherein the converter further comprises a 1-bit D/A converter.

* * * * *